United States Patent
Chatterjee et al.

(10) Patent No.: US 7,304,513 B2
(45) Date of Patent: Dec. 4, 2007

(54) AREA EFFICIENT PROGRAMMABLE FREQUENCY DIVIDER

(75) Inventors: Kallol Chatterjee, West Bengal (IN); Deependra Jain, District Jabalpur (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 227 days.

(21) Appl. No.: 11/213,436

(22) Filed: Aug. 26, 2005

(65) Prior Publication Data

US 2007/0182463 A1 Aug. 9, 2007

(30) Foreign Application Priority Data

Aug. 27, 2004 (IN) .......................... 1629/Del/2004

(51) Int. Cl.
H03K 21/00 (2006.01)
H03K 23/00 (2006.01)
H03K 25/00 (2006.01)

(52) U.S. Cl. ........................................ 327/115; 327/117

(58) Field of Classification Search ................ 327/115, 327/117; 377/47, 48
See application file for complete search history.

(56) References Cited

U.S. PATENT DOCUMENTS 6,882,189 B2 * 4/2005 Tam et al. ................... 327/115

2003/0071664 A1 * 4/2003 Magen ........................ 327/115
2004/0222825 A1 * 11/2004 De Gouy et al. ........... 327/115

OTHER PUBLICATIONS

Larsson, Patrik: "High-Speed Architecture for a Programmable Frequency Divider and a Dual-Modulus Prescalar," May 1996, IEEE Journal of Solid-State Circuits, vol. 31, No. 5, pp. 744-748.*

* cited by examiner

*Primary Examiner*—Linh My Nguyen
*Assistant Examiner*—Diana J Cheng
(74) *Attorney, Agent, or Firm*—Lisa K. Jorgenson; Stephen Bongini; Fleit Kain Gibbons Gutman Bongini & Bianco P.L.

(57) ABSTRACT

A programmable high-speed frequency divider is provided in which a stage for forming a frequency divider, which is capable of being programmed with a programmable dividing ratio, is simplified in order to reduce the area and circuit complexity. The programmable frequency divider includes a first synchronizing element coupled to an output of a logic detection circuit for generating a synchronized divider output, an additional synchronizing element coupled to the output of the logic detection circuit for receiving its clock from the output of a divide-by-two circuit and generating a special synchronized load output, and combinational logic blocks that receive the load output and generate load signals for bit-cells for detecting the state of all stages. Preferably, start-up circuitry is included within the frequency divider to ensure that the frequency-divider never goes into a false state.

16 Claims, 8 Drawing Sheets

AREA EFFICIENT PROGRAMMABLE FREQUENCY DIVIDER

CROSS-REFERENCE TO RELATED APPLICATIONS

This application is based upon and claims priority from prior Indian Patent Application No. 1629/Del/2004, filed Aug. 27, 2004, the entire disclosure of which is herein incorporated by reference.

FIELD OF THE INVENTION

The present invention relates to an improved area efficient programmable frequency divider that allows programming of the dividing ratio of the input clock frequency.

BACKGROUND OF THE INVENTION

In recent years, attention has been given to asynchronous frequency dividers to achieve high speed and low power requirements. For example, a paper by Patrik Larsson published in the "IEEE Journal of Solid-State Circuits", Vol. 31, No. 5, May 1996, discloses the frequency divider shown in FIG. 1.

As shown, the frequency divider has a clock pre-processor circuit 101 that blocks the clock for odd division, a divide-by-two circuit 102 that divides the input clock frequency by a factor of 2, a series of identical bit-cells 103-105, a one detect circuit 106 that detects whether all stages are at the logic-high state, and a D flip-flop 107.

The input clock CLK is applied to the clock pre-processor circuit 101, and to the D flip-flop 107 via an inverter 108. The output 110 of the pre-processor circuit 101 is passed to the divide-by-two circuit 102. The Q-output 111 of the divide-by-two circuit 102 is connected to the input of the first bit-cell 103.

Each bit-cell has two outputs: CLKi and OUTi. The first output OUTi of each bit-cell and the QN output of the divide-by-two circuit 102 are fed to the one-detect-circuit 106, while the second output CLKi of each bit-cell is fed to the input clock of the next bit-cell.

The one-detect-circuit 106 has two sets of inputs. The first set of inputs is the data inputs P1 to Pn while the second set of inputs receives the OUTi outputs of the bit-cells. The first set of inputs is used to determine the bits to be used from the second set of inputs for determination of the output state of the one-detect-circuit 106. The one-detect-circuit 106 starts detection of the state of the data input starting from the MSB of the data input. As soon as it encounters the first logic-high data input it logically ANDs the OUTi outputs of bit-cells numbered from that data input to the remaining data inputs (i.e., the LSB data input) to get the final output of the one-detect-circuit 106. If all the data inputs P1 to Pn are at the logic-low state, then the output of the one-detect-circuit 106 is at the same state as that of the QN output of the divide-by-two circuit 102.

The one-detect-circuit 106 outputs a logic-high signal when the output OUTi of each bit-cell and the QN output of the divide-by-two circuit 102 are at the logic-high state. The output of the one-detect-circuit 106 is fed to the input of the D flip-flop 107. The D flip-flop 107 receives its clock from an inverter 108, so as to receive an inverted input clock.

A standard D flip-flop 107 is used in this counter. It has one data-input D, one clock-input CLK, and two outputs Q and QN. The output of the one-detect-circuit 106 is connected to the D input of the D flip-flop 107. The input clock to the frequency divider is inverted and this inverted output 120 is fed to the CLK input of the D flip-flop 107. The QN output 121 of the D flip-flop is connected to the CLK_BLOCK input of the clock-pre-processor circuit. The Q output 122 of the D flip-flop is coupled to the final output pin of the counter. The LSB of the input data bits P0 is inverted and connected to the POBAR input of the clock pre-processor circuit.

FIG. 2 shows the construction of the divide-by-two circuit. The divide-by-two circuit has one CLK input 401 and two outputs: Q 402 and QN 403. It divides the input clock frequency by a factor of 2.

FIG. 3 shows the clock pre-processor circuit. The circuit has two control inputs, one clock input, and one clock output. The control inputs of the circuit are POBAR 052 and CLK_BLOCK 053, while CLK_IN 051 is the input clock and CLK_OUT 054 is the output clock that is fed to the divide-by-two circuit 102. When both the control inputs of the clock pre-processor circuit are logic-low, its output is logic-high. But when any of the control inputs is logic-high, the output of the clock preprocessor circuit is the inverted value of the input clock.

FIG. 4 shows one bit-cell circuit. It comprises five inputs: CLKi−1 501, Pi 502, LD 503, CLKi+1 504, OUTi−1 505. It also comprises two outputs: CLKi 507 and OUTi 508. CLKi+1 504 is connected to CLKi of the next stage bit-cell, while CLKi−1 501 is connected to CLKi of the previous stage bit-cell. Similarly, OUTi−1 505 is connected to OUTi of the previous stage bit-cell.

Within the bit-cell there is a net LdMem 509. Whenever there is logic-low at P1, logic-low at LD, and logic-high at OUTi, then LdMem goes logic-high. When CLKi+1 and OUTi−1 go high, then net Idout 506 goes logic-low, which in turn forces CLKi to logic-low and OUTi to the logic-high state. As OUTi goes logic-high, LdMem goes logic-low, which in turn forces ldout to logic-high. In normal conditions, when LdMem is at the logic-low state, the bit-cell works as a divide-by-two circuit. It divides the input clock frequency at CLKi−1 by a factor of 2 and gives the output at CLKi and OUTi.

However, according to the structure of this frequency divider, if Q of the first divide-by-two 102 is at logic-low, the output of the clock pre-processor 110 is at logic-high, and all the control inputs of the clock pre-processor circuit are at the logic-low state, then it will get stuck in that state and can never come out. Apart from that, the architecture of the bit-cell circuit is also complex in order to latch the Ldout signal.

SUMMARY OF THE INVENTION

It is an object of the present invention to overcome the above-mentioned problems and to provide a programmable high-speed frequency divider with a simplified bit-cell circuit without loss of implied circuit function and operating speed.

Another object of the present invention is to ensure that the frequency divider does not go into a false state.

Yet another object of the present invention is to generate a load signal for an individual stage using a global signal that is generated for more than one clock cycle.

One embodiment of the present invention provides a programmable frequency divider that includes a clock-preprocessor circuit, a divide-by-two circuit coupled to an output of the clock-pre-processor circuit, a plurality of bit-cells connected in series, a logic detection circuit, a first synchronizing element coupled to an output of the logic detection circuit, an additional synchronizing element coupled to the output of the logic detection circuit, and combinational logic blocks. The clock-preprocessor circuit processes an input clock and blocks one cycle in a case of odd frequency division, and the divide-by-two circuit divides an input frequency to half its value. The clock of a first of the bit-cells is coupled to an output of the divide-by-two circuit, and the logic detection circuit receives an input from each of the bit-cells and from the divide-by-two circuit. The first synchronizing element generates a synchronized divider output, and the additional synchronizing element receives its clock from the output of the divide-by-two circuit and generates a special synchronized load output. The combinational logic blocks receive the load output and generate load signals for the bit-cells for detecting the state of all stages.

Another embodiment of the present invention provides an integrated circuit comprising at least one such programmable frequency divider.

Yet another embodiment of the present invention provides an information processing system that includes at least one such programmable frequency divider.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Preferred embodiments of the present invention provide an improved area efficient programmable frequency divider that includes a clock-preprocessor circuit for processing the input clock and blocking one cycle in the case of odd frequency division, a divide-by-two circuit connected to the output of the clock-pre-processor circuit for dividing the input frequency to half its value, a series of bit-cells connected to each other that each have a simplified loading circuit with the clock of the first bit-cell connected to the output of the divide-by-two circuit, a logic detection circuit that receives input from each of the bit-cells and the divide-by-two circuit, and a synchronizing element connected to the output of the logic detection circuit to generate a synchronized divider output. The programmable frequency divider also includes an additional synchronizing element that is connected to the output of the one-detect-circuit, and multiple combinational logic blocks that receive the load output and generate load signals for the bit-cells for detecting the state of all the stages. The additional synchronizing element receives its clock from the output of the divide-by-two circuit and generates a special synchronized load output.

Preferably, the clock-pre-processor circuit includes a startup transistor that is connected in parallel to the control transistors to ensure that the divider does not go in a false state.

In one embodiment, the bit-cells comprise a divide-by-two circuit, and multiple transistors that are connected to the divide-by-two circuit for loading the bit-cells, so as to load the divided frequency when the load signal is inactive while loading high logic when the signal is active at the output of the bit-cells.

Preferably, the combinational logic generates a load signal for each of the bit-cells using a global signal that is generated for more than one input clock cycle.

One preferred embodiment of the present invention will now be described in detail with reference to FIGS. 5 to 8.

Figure 1:
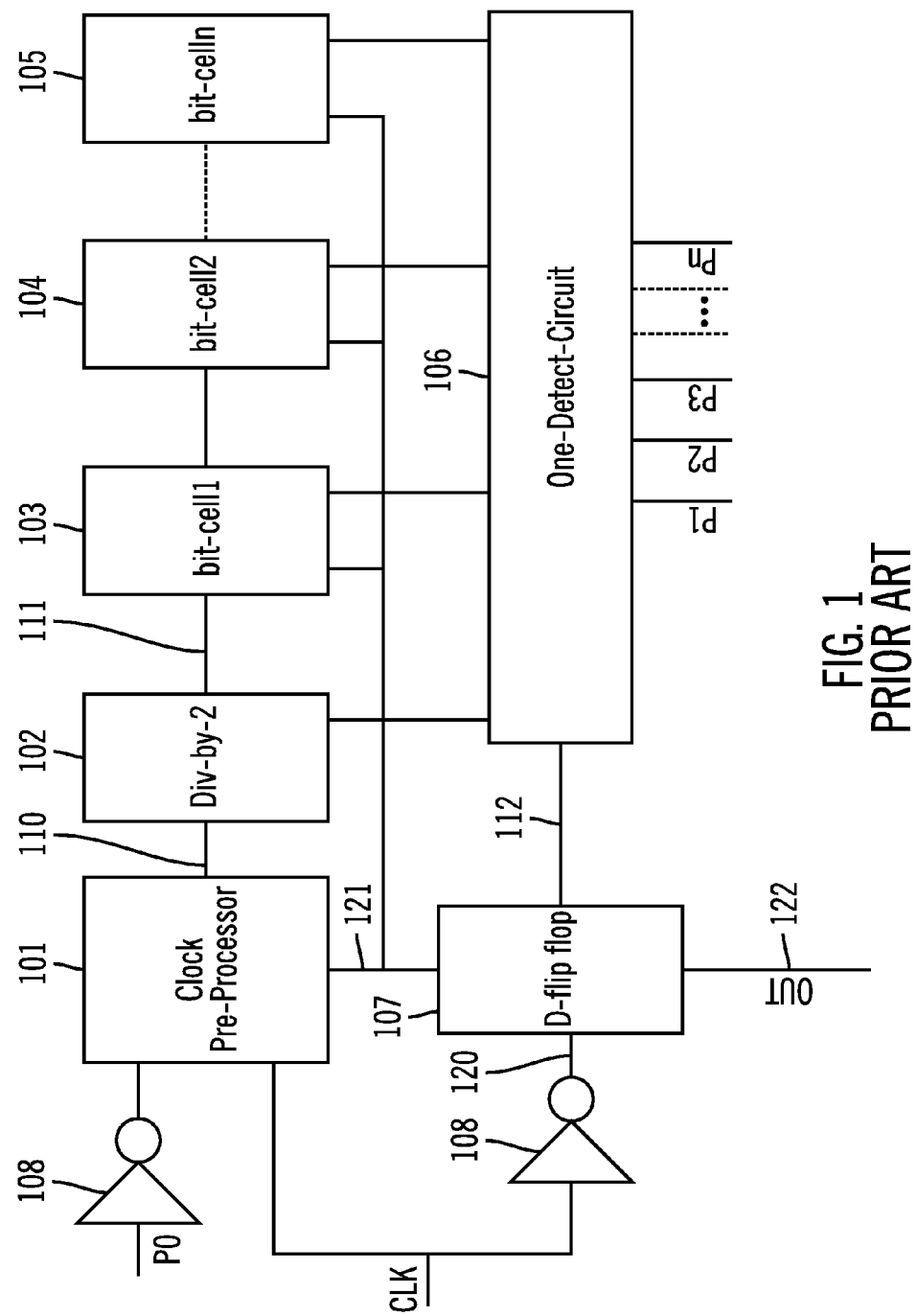
FIG. 1 is a block diagram of a conventional programmable frequency divider.
Figure 2:
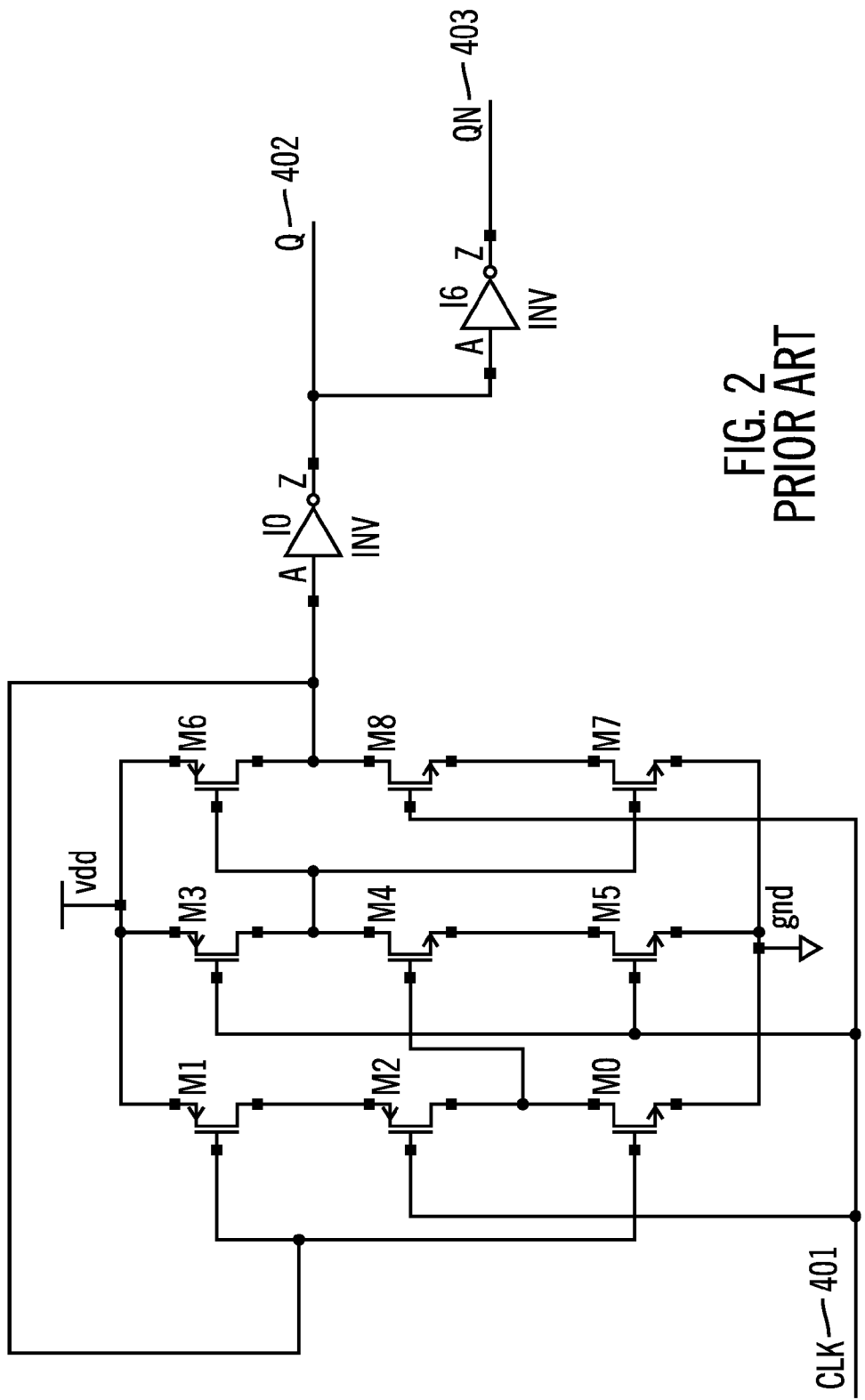
FIG. 2 is a circuit diagram of the divide-by-two circuit of the conventional programmable frequency divider.
Figure 3:
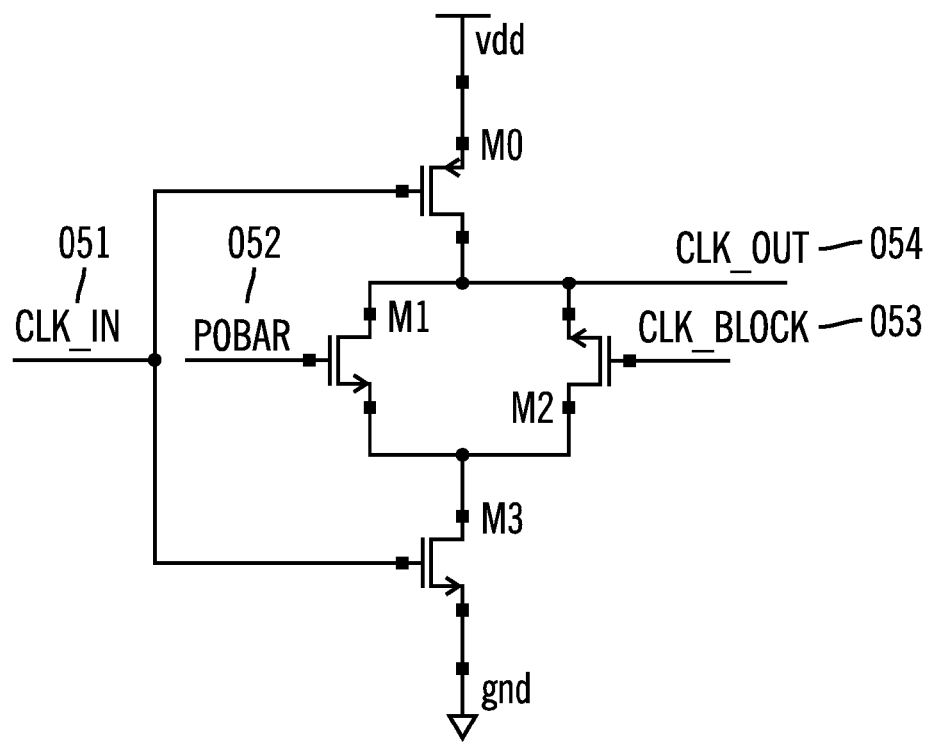
FIG. 3 is a circuit diagram of the clock pre-processor circuit of the conventional programmable frequency divider.
Figure 4:
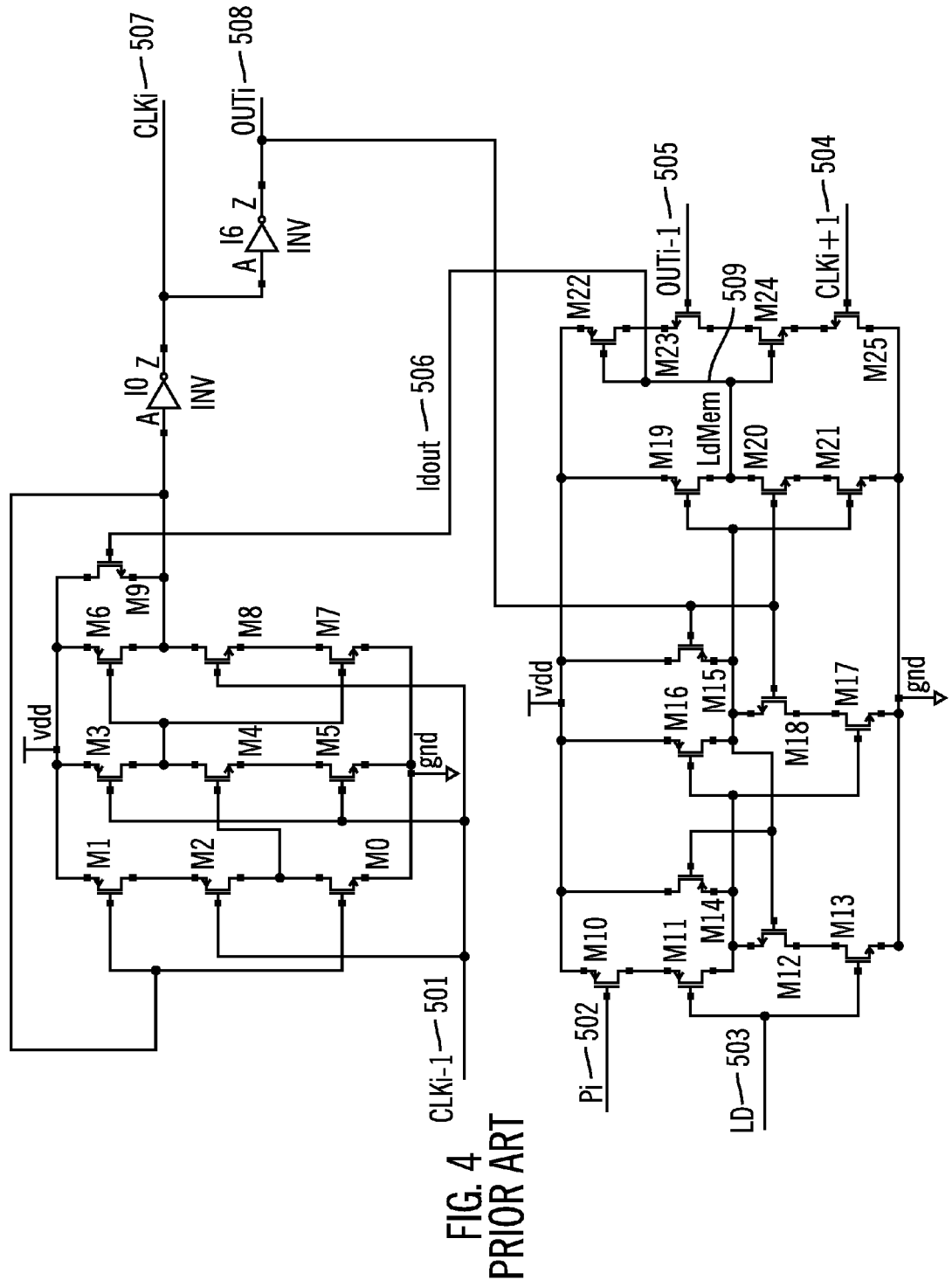
FIG. 4 is a circuit diagram of one bit-cell circuit of the conventional programmable frequency divider.
Figure 5:
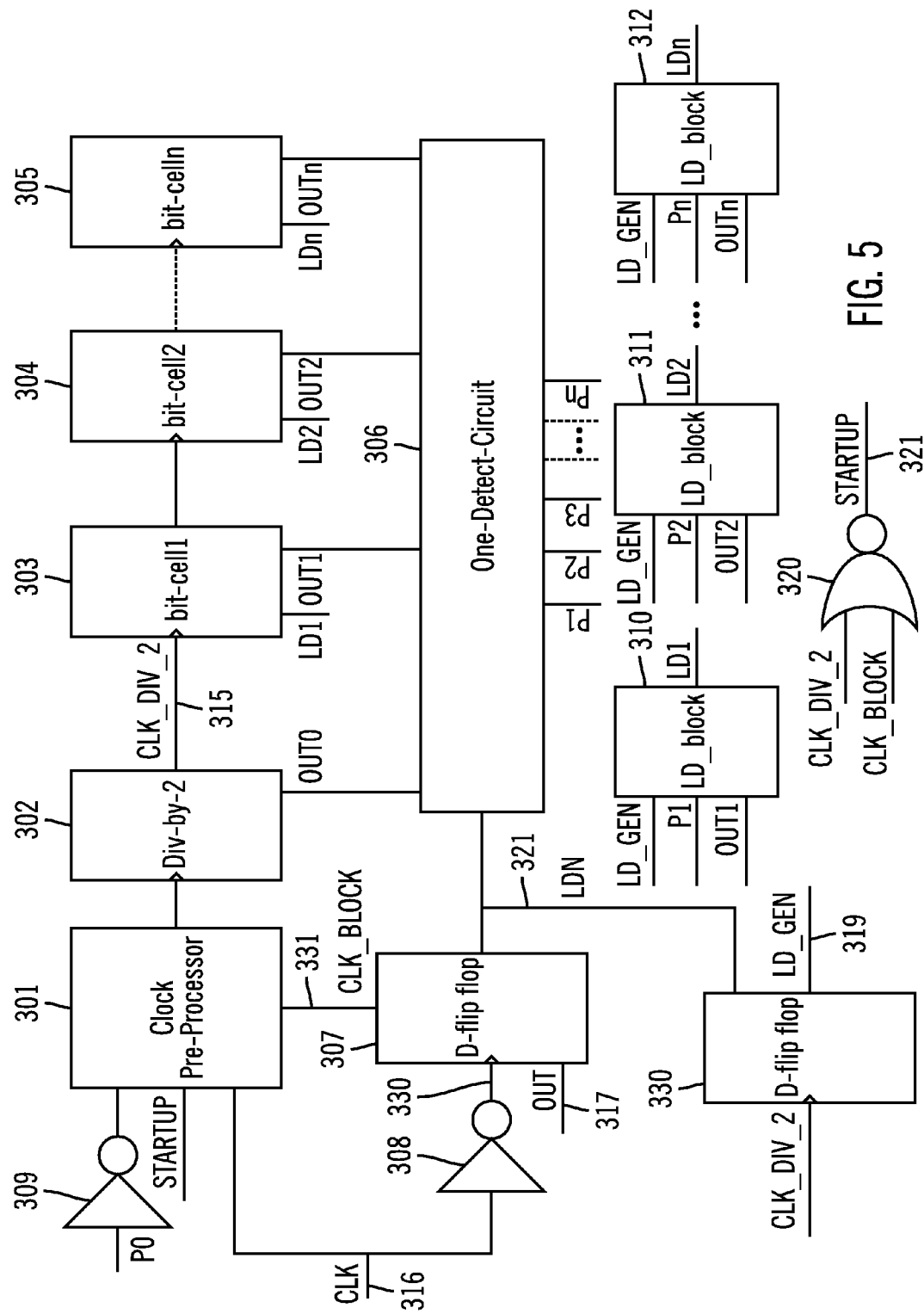
FIG. 5 is a block diagram of a programmable high-speed frequency divider according to a preferred embodiment of the present invention.

FIG. 5 shows a programmable high-speed frequency divider according to one preferred embodiment of the present invention. As shown, the frequency divider includes a clock pre-processor circuit 301 that blocks the clock for odd division, a divide-by-two circuit 302 that divides the input clock frequency by a factor of 2, a series of identical bit-cells 303-305 that is a normal divide-by-two circuit with a load input, a one-detect-circuit 306 that detects whether all stages are at the logic-high state, two D flip-flops 307 and 330, and identical LD-blocks 310-312.

The divide-by-two circuit 302 divides the frequency of the input signal at CLK by 2 and gives the output at OUTi and CLKi, which are logically inverted to each other. The final output LDIN 321 of the one-detect-circuit 306 is fed to the D-input of the two D flip-flops 307 and 330.

Two standard D flip-flops 307 and 330 are used in the counter. Each flip-flop has one data-input D, one clock-input CLK, and two outputs Q and QN. Both D flip-flops 307 and 330 receive LDIN 321 at their D input. The input clock to the frequency divider is inverted and then fed to the CLK input of the first D flip-flop 307. The CLK input CLK_DIV_2 315 of the second D flip-flop 330 is connected to the CLKi output of the divide-by-two circuit. The QN output of first D flip-flop 331 is connected to the CLK_BLOCK input of the clock-pre-processor circuit. The Q output 317 of the first D flip-flop is coupled to the final output pin of the counter. The Q output of the second D flip-flop is LD_GEN 319, which is connected to all LD_blocks to generate the load signal for each bit-cell.

Figure 6:
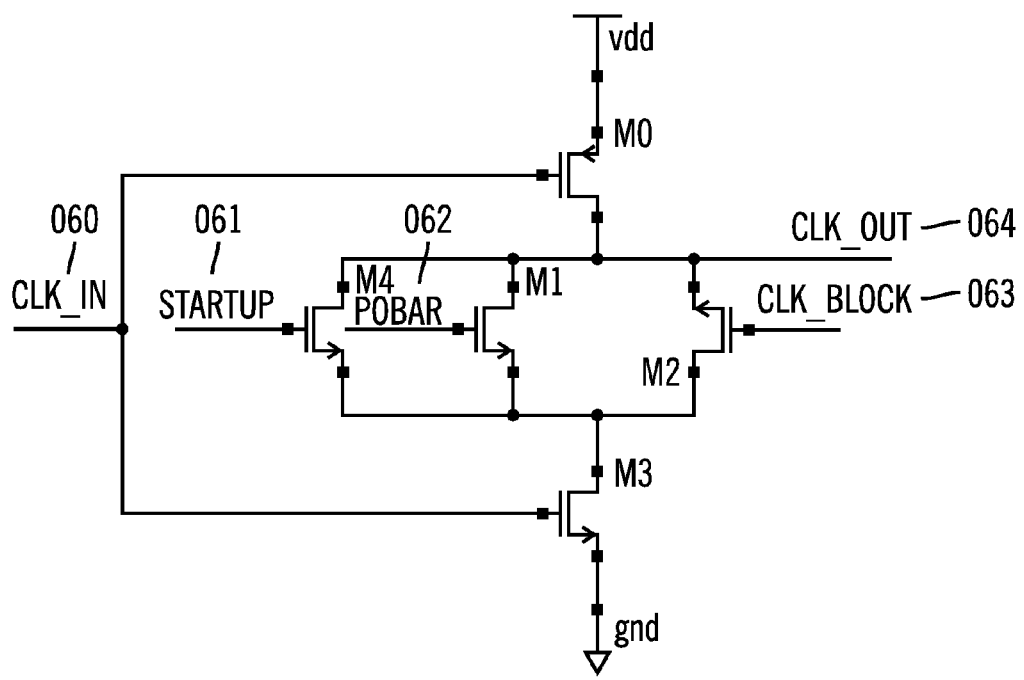
FIG. 6 is a circuit diagram of one embodiment of the clock pre-processor circuit of the programmable high-speed frequency divider according to the preferred embodiment of the present invention.

FIG. 6 shows one embodiment of the clock pre-processor circuit 301. This circuit has three control inputs, one clock input, and one clock output. The control inputs of the clock pre-processor circuit are POBAR 062, STARTUP 061, and CLK_BLOCK 063, while CLK_IN 060 is the input clock and CLK_OUT 064 is the output clock, which is fed to the divide-by-two circuit. When all the control inputs of the clock pre-processor circuit are at logic-low, then its output is at the logic-high state. But if any of the control inputs are at logic-high, the output of the clock pre-processor circuit is the inverted value of the input clock.

Figure 7:
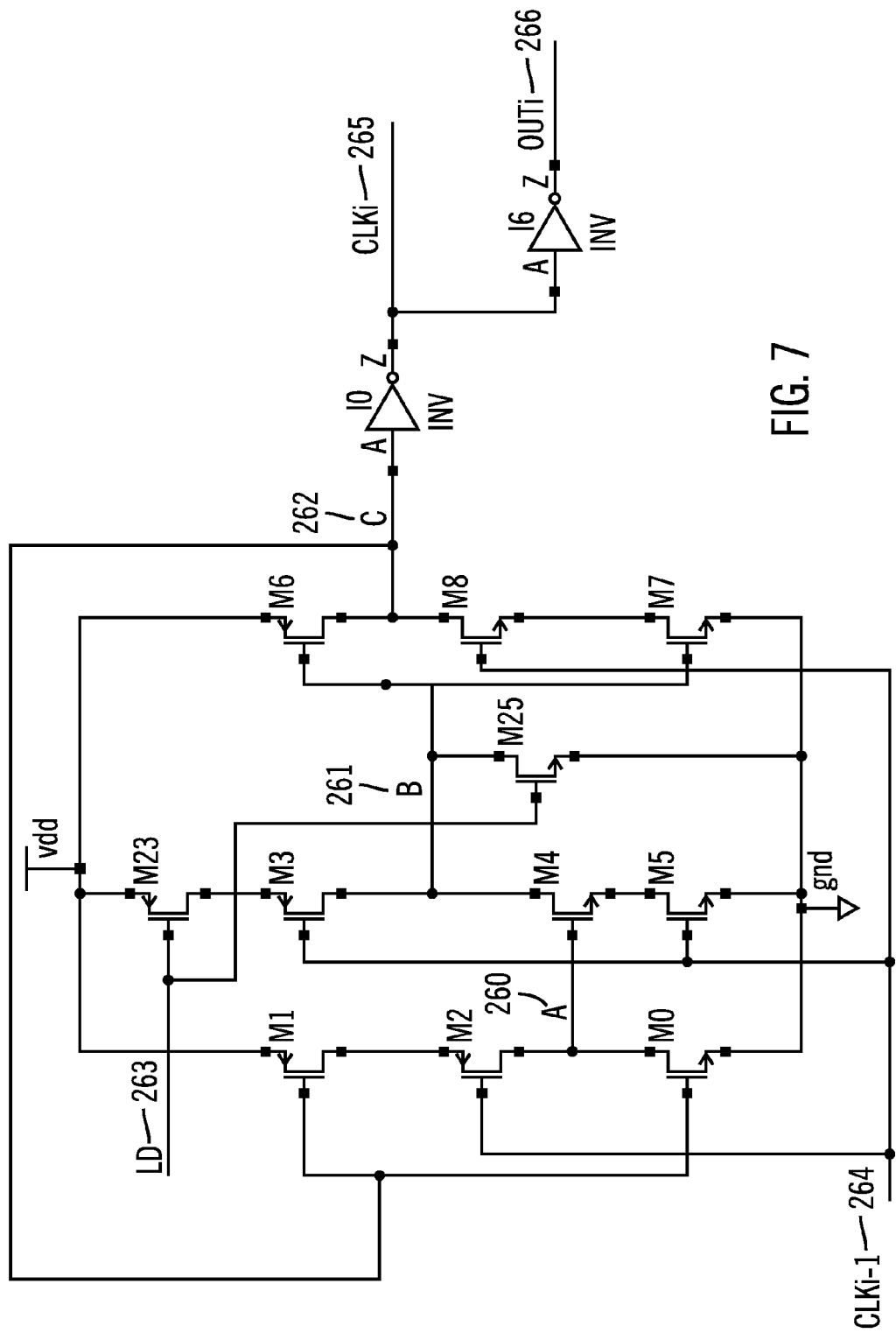
FIG. 7 is a circuit diagram of one embodiment of the bit-cell circuit of the programmable high-speed frequency divider according to the preferred embodiment of the present invention.

FIG. 7 shows one embodiment of the bit-cell circuit. CLKi−1 264 and LD 263 are the two inputs, while CLKi 265 and OUTi 266 are the two outputs. CLKi−1 264 is connected to CLKi of the previous stage bit-cell. In normal conditions, when LD is at the logic-low state, the bit-cell works as a divide-by-two circuit. It divides the input clock frequency at CLKi−1 by a factor of 2 and gives the output at CLKi and OUTi, which are logically inverted to each other. When LD is at the logic-high state, OUTi is forced to be at logic-high and CLKi to be at logic-low. Each bit-cell divides the clock fed to it by a factor of 2 when the load signal is inactive. When the load signal is active, it loads logic-high to the bit-cell output, irrespective of the input clock.

Figure 8:
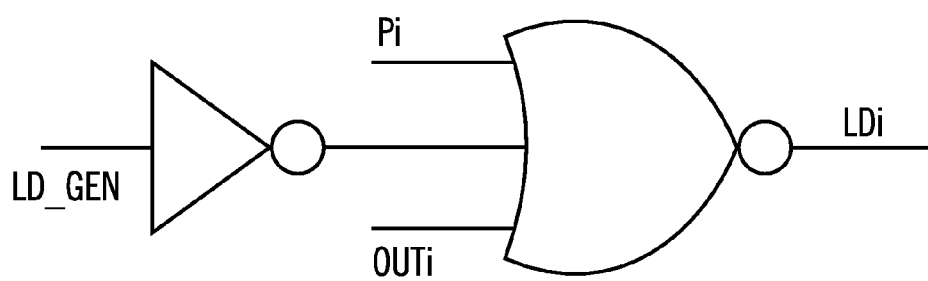
FIG. 8 is a diagram of one embodiment of the LD_block circuit of the programmable high-speed frequency divider according to the preferred embodiment of the present invention.

FIG. 8 shows one embodiment of the LD_block that is used to generate the load signal for each bit-cell. It has three inputs and one output. It has Pi, OUTi, and LD_GEN as inputs, and one LDi output. If Pi and OUTi are at the logic-low state and LD_GEN is at the logic-high state, then LDi is at the logic-high state; otherwise it remains at the logic-low state. There is a separate LD_block for each bit-cell. The Pi input of each LD_block is connected to the corresponding data input, the OUTi input of each LD_block is connected to the OUTi output of the corresponding bit-cell, and the LD_GENi input is connected to the LD_GEN output 319 of the second D flip-flop 330. The LDi signal is connected to the LD input of the corresponding bit-cell.

As shown in FIG. 5, the CLKi output of the divide-by-two CLK_DIV_2 315 and the QN output of the first D flip-flop 307 are logically NORed to generate a STARTUP signal 321. This STARTUP signal is supplied to the STARTUP input of the clock pre-processor circuit.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A programmable frequency divider comprising:
   a clock-preprocessor circuit for processing an input clock and blocking one cycle in a case of odd frequency division;
   a divide-by-two circuit coupled to an output of the clock-pre-processor circuit, the divide-by-two circuit dividing an input frequency to half its value;
   a plurality of bit-cells connected in series, the clock of a first of the bit-cells being coupled to an output of the divide-by-two circuit;
   a logic detection circuit that receives an input from each of the bit-cells and from the divide-by-two circuit;
   a first synchronizing element coupled to an output of the logic detection circuit, the first synchronizing element generating a synchronized divider output;
   an additional synchronizing element coupled to the output of the logic detection circuit, the additional synchronizing element receiving its clock from the output of the divide-by-two circuit and generating a special synchronized load output; and
   a plurality of combinational logic blocks that receive the load output and generate load signals for the bit-cells for detecting the state of all stages.

2. The programmable frequency divider as defined in claim 1, wherein the clock-pre-processor circuit includes a startup transistor that is connected in parallel with control transistors to ensure that the divider does not go into a false state.

3. The programmable frequency divider as defined in claim 2, wherein each of the bit-cells comprises:
   a divide-by-two circuit; and
   a plurality of transistors connected to the divide-by-two circuit for loading the bit-cells, so as to load the divided frequency when the load signal is inactive and load a defined logic state when the load signal is active at the output of the bit-cells.

4. The programmable frequency divider as defined in claim 3, wherein the combinational logic generates a load signal for each of the bit-cells using a global signal that is generated for more than one input clock cycle.

5. The programmable frequency divider as defined in claim 1, wherein each of the bit-cells comprises:
   a divide-by-two circuit; and
   a plurality of transistors connected to the divide-by-two circuit for loading the bit-cells, so as to load the divided frequency when the load signal is inactive and load a predefined logic state when the load signal is active at the output of the bit-cells.

6. The programmable frequency divider as defined in claim 1, wherein the combinational logic generates a load signal for each of the bit-cells using a global signal that is generated for more than one input clock cycle.

7. An integrated circuit comprising at least one programmable frequency divider, the programmable frequency divider including:
   a clock-preprocessor circuit for processing an input clock and blocking one cycle in a case of odd frequency division;
   a divide-by-two circuit coupled to an output of the clock-pre-processor circuit, the divide-by-two circuit dividing an input frequency to half its value;
   a plurality of bit-cells connected in series, the clock of a first of the bit-cells being coupled to an output of the divide-by-two circuit;
   a logic detection circuit that receives an input from each of the bit-cells and from the divide-by-two circuit;
   a first synchronizing element coupled to an output of the logic detection circuit, the first synchronizing element generating a synchronized divider output;
   an additional synchronizing element coupled to the output of the logic detection circuit, the additional synchronizing element receiving its clock from the output of the divide-by-two circuit and generating a special synchronized load output; and
   a plurality of combinational logic blocks that receive the load output and generate load signals for the bit-cells for detecting the state of all stages.

8. The integrated circuit as defined in claim 7, wherein the clock-pre-processor circuit of the programmable frequency divider includes a startup transistor that is connected in parallel with control transistors to ensure that the divider does not go into a false state.

9. The integrated circuit as defined in claim 8,
wherein each of the bit-cells of the programmable frequency divider comprises:
a divide-by-two circuit; and
a plurality of transistors connected to the divide-by-two circuit for loading the bit-cells, so as to load the divided frequency when the load signal is inactive and load a defined logic state when the load signal is active at the output of the bit-cells, and
the combinational logic of the programmable frequency divider generates a load signal for each of the bit-cells using a global signal that is generated for more than one input clock cycle.

10. The integrated circuit as defined in claim 7, wherein each of the bit-cells of the programmable frequency divider comprises:
a divide-by-two circuit; and
a plurality of transistors connected to the divide-by-two circuit for loading the bit-cells, so as to load the divided frequency when the load signal is inactive and load a predefined logic state when the load signal is active at the output of the bit-cells.

11. The integrated circuit as defined in claim 7, wherein the combinational logic of the programmable frequency divider generates a load signal for each of the bit-cells using a global signal that is generated for more than one input clock cycle.

12. An information processing system including at least one programmable frequency divider, the programmable frequency divider comprising:
a clock-preprocessor circuit for processing an input clock and blocking one cycle in a case of odd frequency division;
a divide-by-two circuit coupled to an output of the clock-pre-processor circuit, the divide-by-two circuit dividing an input frequency to half its value;
a plurality of bit-cells connected in series, the clock of a first of the bit-cells being coupled to an output of the divide-by-two circuit;
a logic detection circuit that receives an input from each of the bit-cells and from the divide-by-two circuit;
a first synchronizing element coupled to an output of the logic detection circuit, the first synchronizing element generating a synchronized divider output;
an additional synchronizing element coupled to the output of the logic detection circuit, the additional synchronizing element receiving its clock from the output of the divide-by-two circuit and generating a special synchronized load output; and
a plurality of combinational logic blocks that receive the load output and generate load signals for the bit-cells for detecting the state of all stages.

13. The information processing system as defined in claim 12, wherein the clock-pre-processor circuit of the programmable frequency divider includes a startup transistor that is connected in parallel with control transistors to ensure that the divider does not go into a false state.

14. The information processing system as defined in claim 13,
wherein each of the bit-cells of the programmable frequency divider comprises:
a divide-by-two circuit; and
a plurality of transistors connected to the divide-by-two circuit for loading the bit-cells, so as to load the divided frequency when the load signal is inactive and load a defined logic state when the load signal is active at the output of the bit-cells, and
the combinational logic of the programmable frequency divider generates a load signal for each of the bit-cells using a global signal that is generated for more than one input clock cycle.

15. The information processing system as defined in claim 12, wherein each of the bit-cells of the programmable frequency divider comprises:
a divide-by-two circuit; and
a plurality of transistors connected to the divide-by-two circuit for loading the bit-cells, so as to load the divided frequency when the load signal is inactive and load a predefined logic state when the load signal is active at the output of the bit-cells.

16. The information processing system as defined in claim 12, wherein the combinational logic of the programmable frequency divider generates a load signal for each of the bit-cells using a global signal that is generated for more than one input clock cycle.

* * * * *